Figure 1:
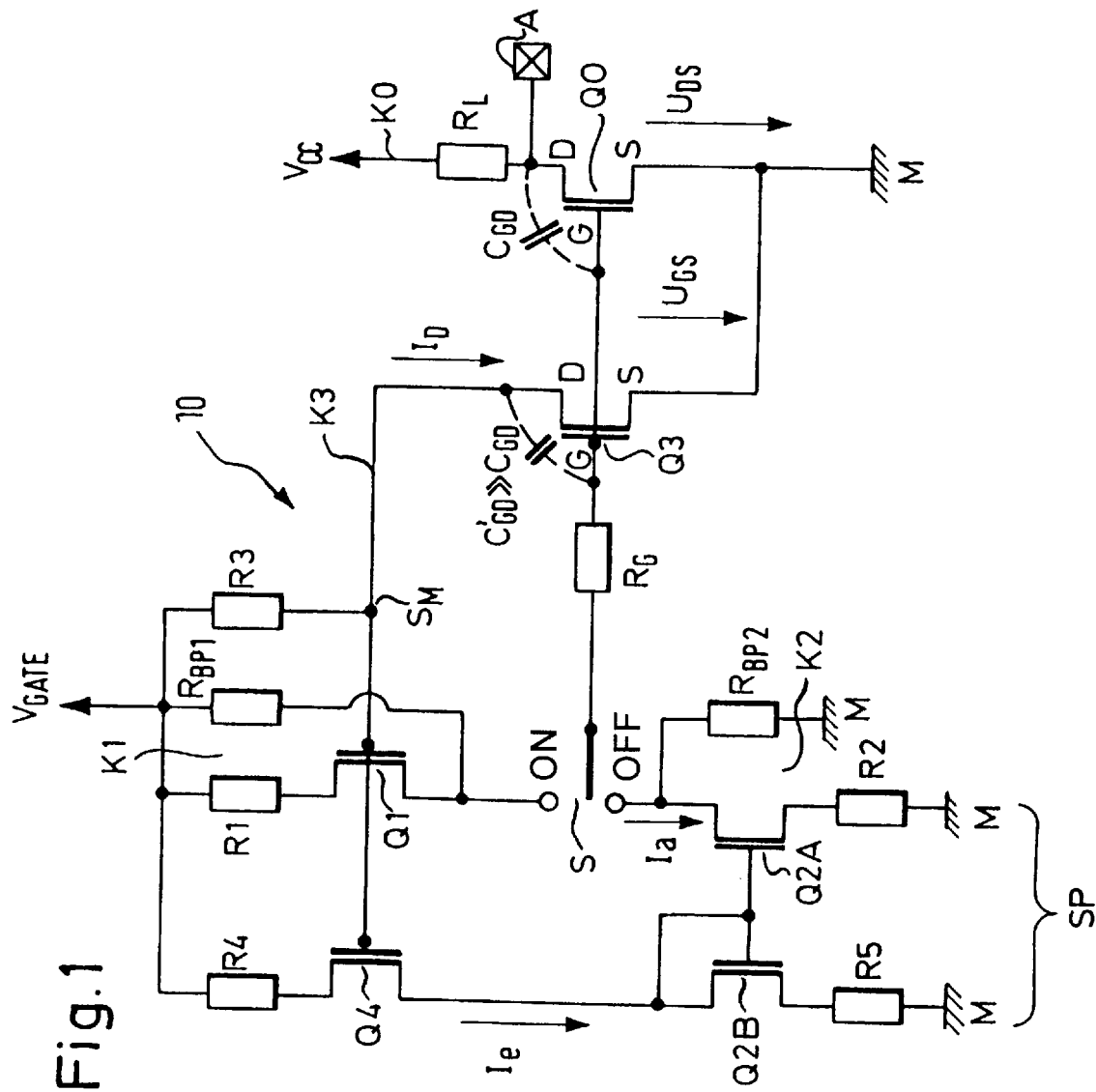

United States Patent [19]
Bayer et al.

[11] Patent Number: 5,841,297
[45] Date of Patent: Nov. 24, 1998

[54] CIRCUIT ARRANGEMENT FOR DRIVING AN MOS FIELD-EFFECT TRANSISTOR ALLOCATED TO THE SUPPLY CIRCUIT OF AN ELECTRICAL LOAD

[75] Inventors: Erich Bayer, Piflas; Konrad Wagensohner, Mauern, both of Germany

[73] Assignee: Texas Instruments Deutschland GmbH, Germany

[21] Appl. No.: 684,900

[22] Filed: Jul. 25, 1996

[51] Int. Cl.[6] .......................... H03K 19/0175; H03K 3/01

[52] U.S. Cl. ................................. 326/83; 326/86; 326/17; 327/432

[58] Field of Search .................... 326/83, 86, 17, 326/121; 327/432, 108

[56] References Cited

U.S. PATENT DOCUMENTS

| | | | |
|---|---|---|---|
| 4,471,238 | 9/1984 | Hickling et al. ........................... | 326/83 |
| 4,481,432 | 11/1984 | Davies, Jr. ................................. | 326/83 |
| 5,120,999 | 6/1992 | Schreck et al. ............................ | 326/83 |
| 5,463,331 | 10/1995 | Kuo ........................................... | 326/86 |
| 5,539,336 | 7/1996 | Nguyen et al. ........................... | 326/83 |
| 5,548,240 | 8/1996 | Bayer ....................................... | 327/432 |
| 5,576,641 | 11/1996 | Yoneya et al. ............................ | 326/83 |
| 5,614,847 | 3/1997 | Kawabara et al. ................... | 326/121 X |
| 5,644,258 | 7/1997 | Wu ............................................ | 326/86 |

*Primary Examiner*—David C. Nelms
*Assistant Examiner*—Huan Hoang
*Attorney, Agent, or Firm*—Richard L. Donaldson; William B. Kempler

[57] ABSTRACT

A circuit arrangement 10 for driving an MOS field-effect transistor QO allocated to the supply circuit KO of an electrical load $R_L$ contains a charging circuit K1 and a discharging circuit K2, which can be alternatively connected to the MOS field-effect transistor QO. A sensing circuit K3 supplies the measuring signal $S_M$ typical of gate-source voltage $U_{GS}$ of the MOS field-effect transistor QO, via which the internal resistance of the charging or discharging circuit K1, K2 and/or a current $I_a$ impressed upon these circuits K1, K2, in the sense of a positive feedback, is controlled, in such a way that the resulting time constant, according to which the input capacitance of the MOS field-effect, transistor QO is charged or discharged, becomes smaller during the transition of the MOS field-effect transistor QO from the off state to the conductive state and larger during the transition from the conductive to the off-state.

14 Claims, 4 Drawing Sheets

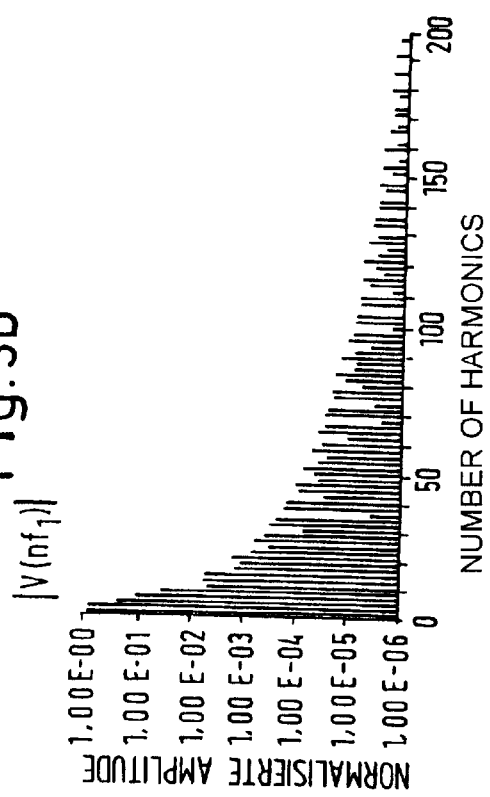
Fig. 3a
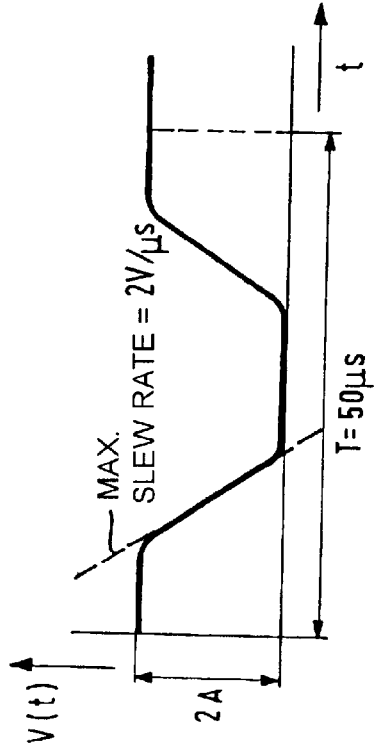
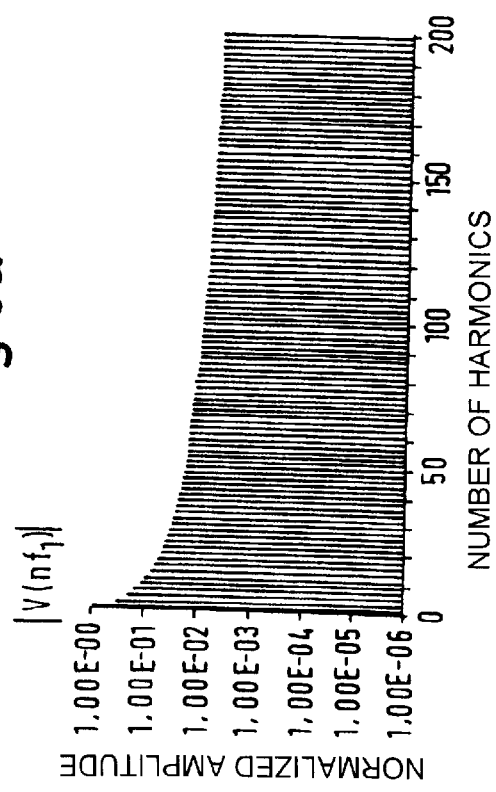
Fig. 3b
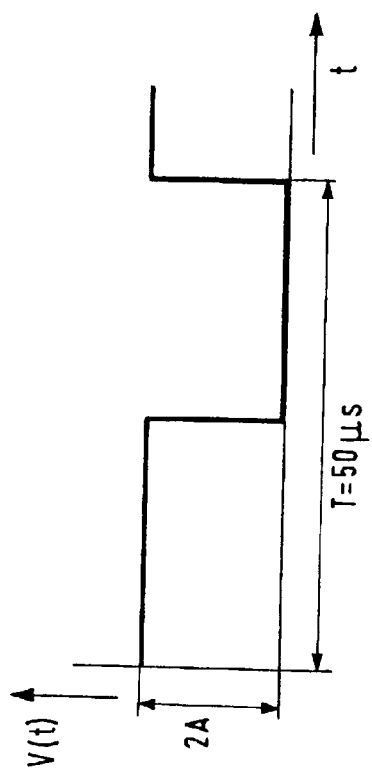

CIRCUIT ARRANGEMENT FOR DRIVING AN MOS FIELD-EFFECT TRANSISTOR ALLOCATED TO THE SUPPLY CIRCUIT OF AN ELECTRICAL LOAD

The invention relates to a circuit arrangement for driving an MOS field-effect transistor allocated to the supply circuit of an electrical load, having a charging circuit that can be connected to the MOS field-effect transistor and a discharging circuit that can be connected to the MOS field-effect transistor, via which the input capacitance of the MOS field-effect transistor can be charged or discharged according to a time constant that is dependent upon the magnitude of the input capacitance and the dimensional design of the charging or discharging circuit.

The MOS field-effect transistor to be driven can, for example, be an MOS- power transistor in an H-bridge intended to supply an electrical load and in particular, a so-called Low-Side Driver (LSD).

Normally an MOS field-effect transistor of this type is driven. via a gate resistance, through which the gate electrode can either be applied to a fixed potential or connected to the source electrode, in order to turn on and turn off the transistor. The gate resistance together with the gate drain capacitance, in particular, forms a so-called Miller integrator which, during a specific time interval of a relevant changeover action, bring about a slew rate of the output signal which is at least, in essence, constant. Whilst the output signal at the end of an appropriate turn-on process and at the beginning of an appropriate turn-off process changes relatively slowly, abrupt voltage changes occur at the beginning of such a turn-on process and at the end of such a turn-off process, which inevitably contribute towards a high proportion of higher harmonics in the output signal. This proportion of higher harmonics becomes all the greater, the more the output signal approaches a square-wave signal or the more angular the curve of the output signal becomes.

The proportion of higher harmonics in the output signal of the MOS field-effect transistor can now be reduced by generating output signals with edges that have the least possible steepness or the slowest possible slew rate, through appropriate energization. In certain applications, for example that of a step-by-step control or a pulse width modulator, however, periodic switching according to prescribed switching frequencies is necessary, for which the steepest possible edges are assumed. High slew rates in the case of the output signal, may, moreover, be necessary in view of the effect of the edge steepness on the power dissipation that occurs in the case of a pulse width modulator. This in turn, now results in a higher electromagnetic hum. Depending on application, this can mean opposing demands being made on the slew rates of the output signal.

It is the task of the invention to create a circuit arrangement of the type mentioned above, that can be executed relatively simply, with which the proportion of higher harmonics in the output signal of the MOS field-effect transistor of the supply circuit, is reduced without any restrictions with regard to the edge steepness required.

The task is solved by the invention in that a sensing circuit is provided, which delivers a measuring signal that is representative of the gate source voltage of the MOS field-effect transistor of the supply circuit, and that the internal resistance of the charging or discharging circuit and/or a current impressed on these circuits in the sense of a positive feed-back, is controlled in such a way that the resulting time-constant, according to which the input capacitance of the MOS field-effect transistor of the supply circuit, is charged or discharged, becomes continuously smaller during the transition of the MOS field-effect transistor from the off-state to the conductive state and becomes continuously larger during the transition from the conductive to the off-state.

By virtue of this development, the MOS field-effect transistor allocated to the supply circuit of the electrical load, is driven in such a way that sharp edges or abrupt changes in the shape of the output signal are avoided, whilst the slew rates of this output signal in the uncritical range, are kept relatively high. The critical segments of the shape of the output signal at the start of the turn-on process and at the end of the turn-off process, now have a sinusoidally rounded shape. During the turn-on process or during the transition of the MOS field-effect transistor from the off-state to the conductive state the slew rate of the output signal is increasingly raised, which is attributable to a corresponding reduction in the time constant, according to which the input capacitance of the MOS field-effect transistor is applied. This time constant can, therefore, be relatively large in the critical starting phase. At the end of this turn-on process, a rounded, edge-less transition to the appropriate final value of the output signal is produced as a result of the typical course of the drain-source resistance in relation to the gate-source voltage.

On the contrary, during the turn-off process or during the transition of the MOS field-effect transistor from the conductive to the off-state, the slew rate of the output signal is continuously reduced, which is attributable to a corresponding increase in the time constant, according to which the input capacitance of the MOS field-effect transistor in this phase is applied. Therefore, this time constant can also be relatively large in the critical final phase of this turn-off process. At the beginning of the turn-off process there is again a rounded, edge-less transition, because of the typical characteristic of the drain-source resistance in relation to the gate-source voltage.

The sensing circuit contains preferably an MOS field-effect transistor, the gate electrode of which is connected to the gate electrode of the MOS field-effect transistor of the supply circuit and the source electrode of which is connected to the source electrode of the MOS field-effect transistor of the supply circuit. Consequently, there is always the same constant gate-source voltage at the MOS field-effect transistor of the sensing circuit as at the MOS field-effect transistor allocated to the supply circuit of the electrical load, so that, for example, a measuring signal representative of the gate-source voltage of the MOS field-effect transistor being controlled, can be generated. For this, the MOS field-effect transistor of the supply circuit can be connected to the electrical load and the MOS field-effect transistor of the sensing circuit can be connected to the resistance concerned, in each case, in a source connection.

According to a preferred embodiment, the charging and/or discharging circuit each contains a parallel connection consisting of an initial branch circuit with at least one initial ohmic resistance and a second branch circuit consisting of a second, controllable resistance, which is driven in accordance with the measuring signal and is formed, preferably by a MOS field-effect transistor again. In this case, the resulting time constant by which the input capacitance of the MOS field-effect transistor of the supply circuit is charged or discharged, can be set in a straight forward manner via the internal resistance of the parallel connection. The internal resistance is at its greatest when the MOS transistor in question is turn offd and at its smallest when the MOS field-effect transistor is conductive.

The initial branch circuit, containing the MOS field-effect transistor, of the parallel connection contained in the discharging circuit is advantageously formed by the output-side branch circuit of a current mirror, in the input side branch circuit of which is provided a further, controllable resistance, which is driven in relation to the measuring signal. The discharging circuit therefore acts as a current sink, on which is impressed, via the current mirror, a current, via which the time constant which is decisive for discharging the input capacitor of the MOS field-effect transistor to be driven, can be set. The controllable resistance provided in the input-side branch circuit of the current mirror can, in turn, be formed by an MOS field-effect transistor, which is driven preferably directly by the measuring signal. Via this MOS field-effect transistor, which is acting as a controllable resistance, the input current of the current mirror can be set according to the shape of the measuring signal. The current impressed upon the first circuit of the parallel circuit of the discharging circuit, is then set via the input current.

Between the gate electrode of the MOS field-effect transistor of the supply circuit and the connectable charging or discharging circuit, it is possible to connect a gate-resistance which, from preference is smaller than the largest adjustable internal resistance of the charging or discharging circuit.

Further advantageous practical variants of the invention are listed in the sub-claims.

The invention is explained below in greater detail using a practical example with reference to the drawing.

Figure 2:
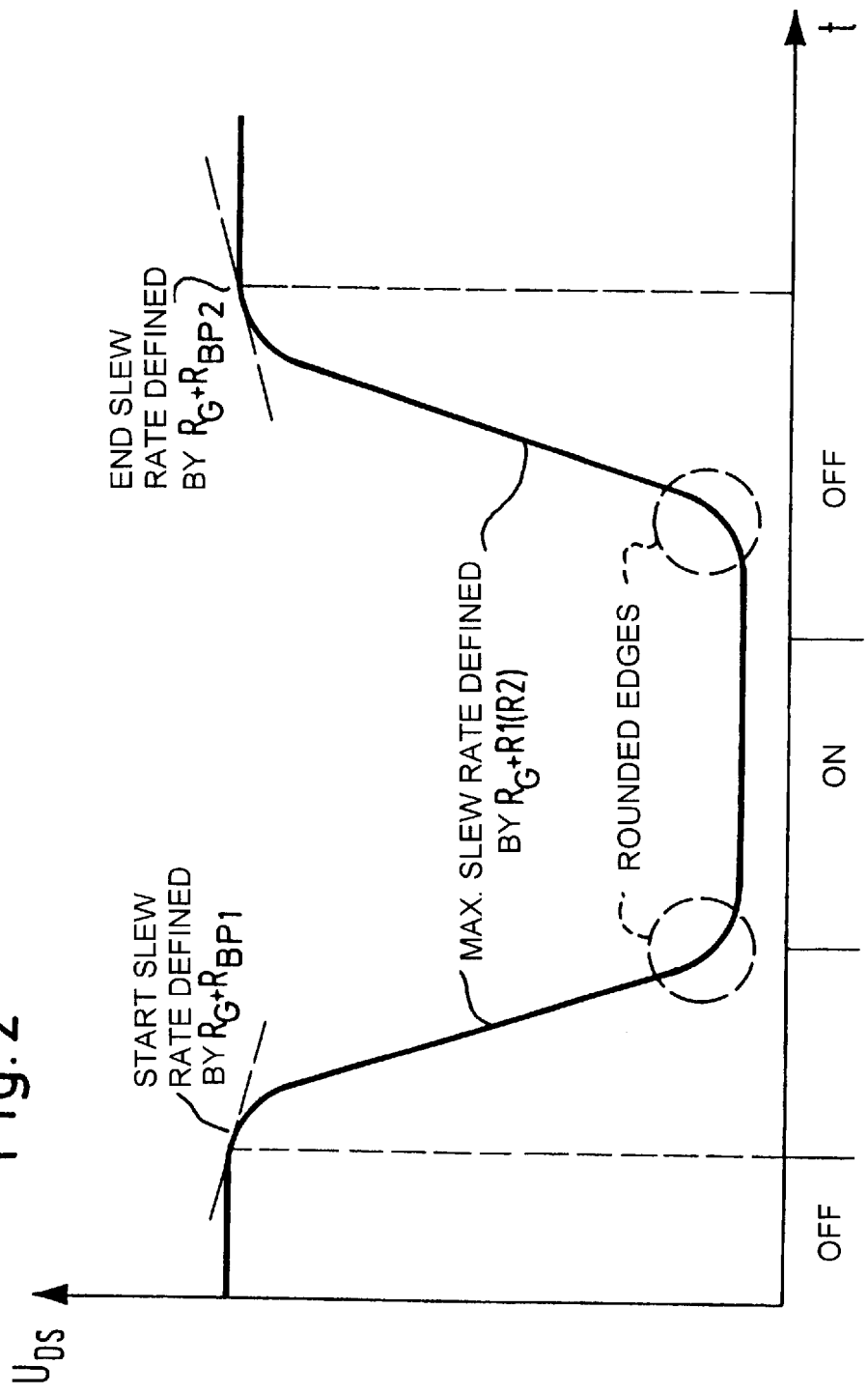
Figure 4:
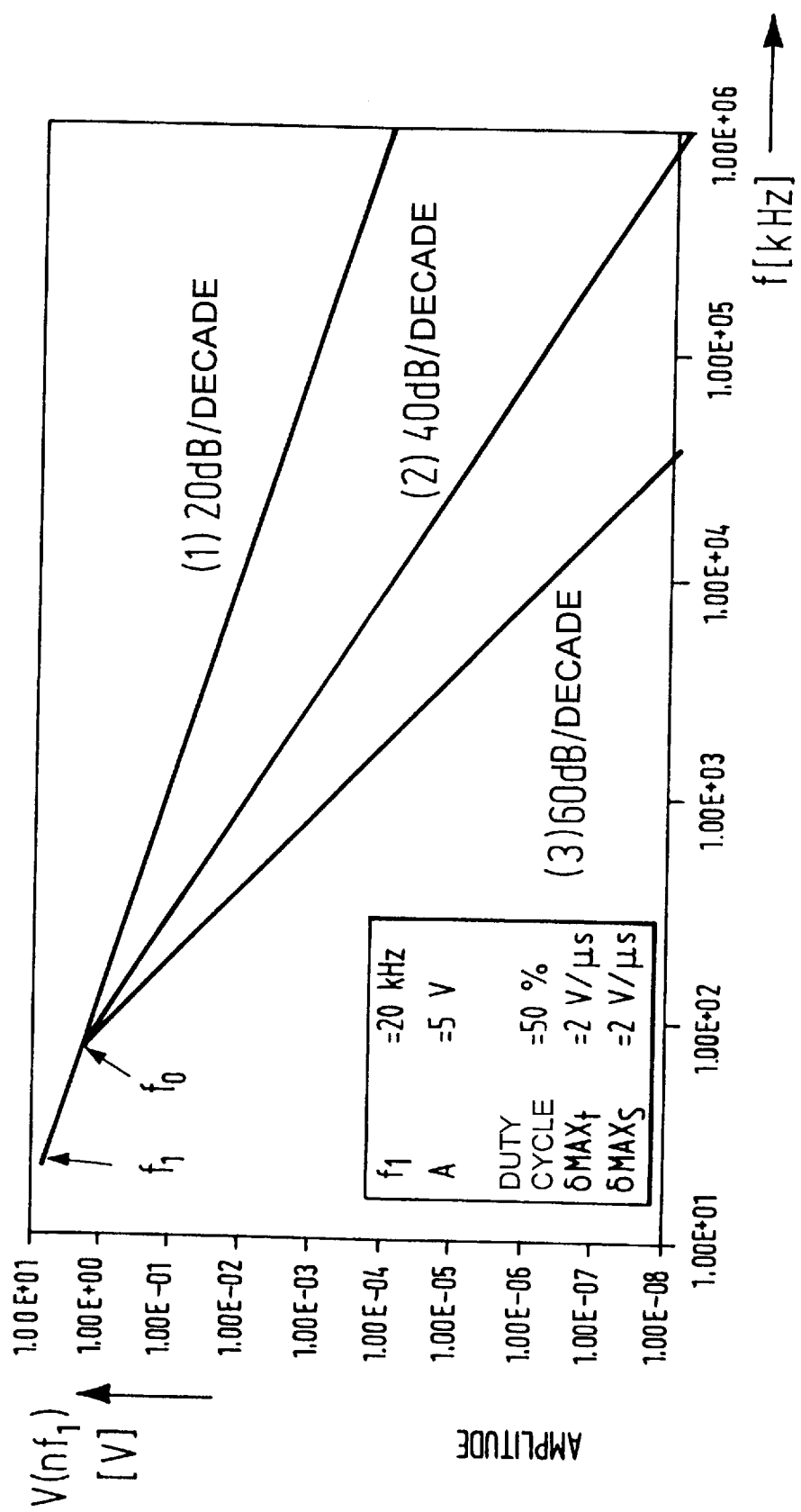

FIG. 1 shows a practical example of a circuit arrangement according to the invention for driving an MOS field-effect transistor FIG. 2 shows a diagram which reproduces the time characteristic of the drain-source voltage of the driven MOS field-effect transistor during one turn-on and one turn-off process FIGS. 3a and 3b show the frequency spectrum of the output signal of a MOS field-effect transistor driven by the circuit arrangement according to the invention, compared with the frequency spectrum of a square-wave signal and FIG. 4 shows a logarithmic representation of the amplitudes of higher harmonics compared with the frequency for square wave signal, a square wave signal with trapezoidal edges and a square wave signal with sinusoidally rounded edges according to the invention.

FIG. 1 shows in schematic form a practical example of a circuit arrangement 10 for driving an MOS field-effect transistor QO, which in the present case, is allocated to the supply circuit KO of an electrical load $R_L$.

The MOS field-effect transistor QO of the supply circuit KO is connected to the electrical load $R_L$ in a source connection, where the source electrode is connected to ground M and the drain electrode is connected to the supply voltage $V_{cc}$ via the load $R_L$. Either a charging circuit K1 or a discharging circuit K2 can be connected to the MOS field-effect transistor QO of the supply circuit KO via an electronic reversible switch S.

The charging circuit K1 consists of a parallel connection made up of an initial ohmic resistance $R_{BP1}$ and a series circuit, in which an MOS field-effect transistor Q1 acting as a second, controllable resistance, is connected in series to a current limiting resistance R1. This charging circuit K1 formed by a parallel circuit is connected at one end to a fixed potential $V_{GATE}$. The other end of this charging circuit K1, marked "ON", can be connected via the electronic switch S to the gate electrode of the MOS field-effect transistor QO of the supply circuit KO, in order to turn on this MOS field-effect transistor QO.

The discharging circuit K2 also consists of a parallel connection made up of an initial ohmic resistance $R_{BP2}$ and a series circuit, in which an MOS field-effect transistor Q2A, acting as a second, controllable resistance, is connected in series to a current limiting resistance R2. At one end, this discharging circuit K2 formed by a parallel connection, is connected to ground M. Then other end, marked "OFF" of the discharging circuit K2 can be connected to the gate electrode of the MOS field-effect transistor of the supply circuit KO via the electronic switch S, in order to turn off this MOS field-effect transistor QO.

A further gate electrode $R_G$ is connected between the gate electrode of the MOS field-effect transistor QO of the supply circuit KO and the connectable charging or discharging circuit K1, K2.

A sensing circuit K3 is used to deliver a measuring signal $S_M$ representative of the gate-source voltage $U_{GS}$ of the MOS field-effect transistor QO of the supply circuit KO. For this, the sensing circuit K3 contains an MOS field-effect transistor Q3, the source electrode of which is connected with the source electrode of the MOS field-effect transistor QO of the supply circuit KO or is connected to earth M and the drain electrode of which is connected to the fixed potential $V_{GATE}$ via an ohmic resistance R3, at which resistance the measuring signal $S_M$ is generated.

Consequently, just like the MOS field-effect transistor QO of the supply circuit KO, the MOS field-effect transistor Q3 of the sensing circuit K3 is also connected to the relevant resistance, in this case R3, in a source connection, where the drain electrode of the MOS field-effect transistor Q3, however, is not connected via the resistance R3 to the supply voltage $V_{cc}$, but to the fixed potential $V_{GATE}$ which is required to turn on the MOS field-effect transistor QO.

Moreover, the gate electrode of the MOS field-effect transistor Q3 of the sensing circuit K3 is connected to the gate electrode of the MOS field effect transistor QO of the supply circuit KO. The junction of the drain electrode of the MOS field-effect transistor Q3 and the ohmic resistance R3 is connected to the gate electrode of the MOS field-effect transistor Q1 of the charging circuit K1, which is acting as a controllable resistance.

The branch circuit, formed by the series circuit made up of the MOS field effect transistor Q2A and the current limiting resistance R2, of the parallel connection forming the discharging circuit K2, is formed by the output-side branch circuit of a current mirror SP, onto which is impressed a current $I_a$ via the input-side branch circuit of this current mirror SP, as soon as the discharging circuit K2 is connected to the gate electrodes of the MOS field-effect transistors Q3 and QO via the electronic switch S and the gate resistance $R_G$.

An MOS field-effect transistor Q4 again acting as a controllable resistance is connected in series to an ohmic resistance R4 in the input-side branch circuit of the current mirror SP. The drain electrode of the MOS field-effect transistor Q4 is connected to the fixed potential $V_{GATE}$ via this ohmic resistance R4. To this MOS field-effect transistor Q4, is connected in series, in the input-side branch circuit of the current mirror SP, a further MOS field-effect transistor Q2B, the drain electrode of which is connected to the source electrode of the MOS field-effect transistor Q4 and the source electrode of which is connected to earth via a further ohmic resistance R5. The drain electrode of the MOS field-effect transistor Q2B is connected to the gate electrode of the latter, which in turn is connected to the gate electrode of the MOS field-effect transistor Q2A of the discharging circuit K2.

The mode of operation of this circuit arrangement shown in FIG. 1 for driving an MOS field-effect transistor allocated to the supply circuit of an electrical load, is as follows:

Turn-on Process

In order to turn on the MOS field-effect transistor QO allocated to the supply circuit KO for the electrical load $R_L$, the charging circuit K1 is connected via the electronic switch S. The end of the charging circuit K1 marked "ON" is connected via the gate resistance $R_G$ to the gate electrodes of the MOS field-effect transistor QO and of the MOS field-effect transistor Q3 allocated to the sensing circuit K3.

At the beginning of this turn-on process, the gate-source voltage $U_{GS}$ of the MOS field-effect transistor QO and therefore also the gate source voltage of the MOS field-effect transistor Q3 of the sensing circuit K3, equals zero. Consequently, no drain voltage $I_D$ is flowing yet in the sensing circuit K3. Accordingly, no drop in voltage occurs yet at the resistance R3, so that no measuring signal $S_M$ is delivered, which would enable the MOS field-effect transistor Q1 of the charging circuit K1 to be driven. This MOS field-effect transistor Q1 initially remains off, so that the internal resistance of the charging circuit K1 is determined solely by the resistance $R_{BP1}$, which, in the practical example illustrated, is considerably larger than the gate resistance $R_G$. The instantaneous time constant τ, according to which the input capacitance of the MOS field-effect transistors QO and Q3 is charged, is accordingly determined for the time being by the total of the two resistances $R_{BP1}$ and $R_G$ as well as the magnitude of the input capacitance. Because of the relatively large dimensioned resistance $R_{BP1}$, this initial time constant is relatively large, which entails a correspondingly low slew rate of the output signal A that can be picked up at the drain electrode of the MOS field-effect transistor QO, at the start of the turn-on process.

As soon as the gate-source voltage of the two MOS field-effect transistors QO and Q3 has reached the threshold voltage, the MOS field-effect transistor Q3 in the sensing circuit K3 supplies a drain current $I_D$, which in turn results in a voltage drop at the resistance R3, in order to generate a corresponding measuring signal $S_M$. By appropriately driving the MOS field-effect transistor Q1 provided in the charging circuit K1, the drain source resistance of the MOS field-effect transistor Q1 is reduced. The more the input capacitances of the MOS field-effect transistors QO and Q3 are charged, i.e. the greater the gate source voltage $U_{GS}$ of these two transistors QO, Q3 becomes, the more the MOS field-effect transistor Q1 of the charging circuit K1 is switched through because of a corresponding increase in the voltage drop at the resistance R3. The current flowing through the MOS field-effect transistor Q1 of the charging circuit K1 is limited only by the resistance R1. Accordingly, the gate voltage available to the MOS field-effect transistors QO and Q3 is all the higher, the greater the drain current ID flowing through the MOS field-effect transistor Q3 and the resistance R3 of the sensing circuit K3.

The slew rate of the output signal A consequently becomes increasingly faster which in turn, is attributable to the ever diminishing time constant τ, by which the input capacitance of the MOS field-effect transistors QO and Q3 is charged. This input capacitance is decisively determined, in the case of the MOS field-effect transistor QO of the supply circuit KO, by the gate-drain capacitance $C_{GD}$, which must be taken into account because of the capacitive feedback which occurs here. Compared with this, the gate-drain capacitance $C_{GD}$ in the case of the MOS field-effect transistor Q3 provided in the sensing circuit K3, is significantly less.

This therefore, results in a positive feedback loop containing the MOS field-effect transistor Q3 of the sensing circuit K3 and the MOS field-effect transistor Q1 of the charging circuit K1. The maximum slew rate of the output signal A, or the smallest time constant is reached, as soon as the MOS field-effect transistor Q1 of the charging circuit K1 is fully switched. Since R1 is significantly smaller than $R_{BP1}$, the internal resistance of the charging circuit K1 in this case is mainly provided by R1, so that the minimum time constant is determined by the sum of the resistances R1 and $R_G$ and by the relevant input capacitance of the MOS field-effect transistors QO and Q3.

FIG. 2 illustrates the drain-source voltage $U_{DS}$ which is decisive for the output signal A, plotted against time. According to this, the slew rate of the drain-source voltage $U_{DS}$ during the turn-on process, i.e. during the transition of the MOS field-effect transistor QO from the off to the conductive state increases, which is attributable to a corresponding decrease in the time constant τ, according to which the input capacitance of the MOS field-effect transistors QO and Q3 is charged. If the time constant τ during the critical starting phase of turning on is relatively large, then instead of the sharp-edged transition that has been normal hitherto, a sinusoidally rounded transition is obtained. If the MOS field-effect transistor Q1 of the charging circuit K1 is switched, then the time constant τ is determined by the sum of the resistances R1 and $R_G$, which subsequently brings about an essentially constant slew rate. At the end of the turn-on process, a rounded transition is obtained because of the typical shape of the drain-source resistance in relation to the gate-source voltage, despite the switched MOS field-effect transistor Q1.

Turn-off Process

In order to turn-off the MOS field-effect transistor QO allocated to the supply circuit KO, the discharging circuit K2 is connected to the latter via the electronic switch S. The end marked "Off" of the parallel connection forming the discharging circuit K2 is connected via the gate resistance $R_G$ to the gate electrodes of the MOS field-effect transistor QO and of the MOS field-effect transistor Q3 contained in the sensing circuit K3.

At the beginning of the turn-off process the gate-source voltage $U_{GS}$ of the two MOS field-effect transistors QO and Q3 is still well above the threshold voltage. The MOD field-effect transistor Q3 of the sensing circuit K3 is switched through, so that a corresponding drain current $E_D$ flows, which causes a large drop in voltage at the resistance R3 of the sensing circuit 10. Because of the measuring signal $S_M$ generated, the MOS field-effect transistor Q4 in the input-side branch current of the current mirror SP which acts as a controllable resistance, is also switched through, thereby generating a correspondingly large input current $I_e$ in this branch circuit. Consequently, a correspondingly large current $I_a$ is impressed upon the branch current of the discharging circuit K2 containing the MOS field-effect transistor Q2A, said large current $I_a$ only being limited by the resistance R2 as a result of the MOS field-effect transistor Q2A which has been switched through. The input capacitance of the MOS field-effect transistors QO and Q3 is therefore initially discharged according to a relatively small time constant τ, which is determined by the sum of the resistances R2 and $R_G$ and the value of the input capacitance.

The closer the gate-source voltage $U_{GS}$ of the MOS field-effect transistors QO and Q3 come to the threshold voltage, the smaller the drain current $I_D$ flowing through the MOS field-effect transistor Q3 of the sensing circuit K3.

Thus, the voltage drop at the resistance R3 also becomes smaller, whereby the MOS field-effect transistor Q4 of the current mirror SP is increasingly non-conducting because of the correspondingly reduced measuring signal $S_M$. The input current $I_e$ of the current mirror SP is thereby reduced, which in turn means that its output current $I_a$ becomes smaller, which is being impressed upon the branch current of the discharging circuit K2 containing the MOS field-effect transistor Q2A. This can be attributed to the increasing non-conductivity of the MOS field-effect transistor Q2A. As a result therefore, the discharging current for the two MOS field-effect transistors QO and Q3 becomes smaller, which is equivalent to reducing the slew rate of the output signal A or the drain-source voltage $U_{DS}$ of the MOS field-effect transistor QO allocated to the supply circuit KO. This in turn is caused by an increasing time constant $\tau$, according to which the input capacitance of the two MOS field-effect transistors QO and Q3 is discharged. The maximum time constant $\tau$ is obtained when the MOS field-effect transistor Q2A is off. In this case, the current $I_a$ impressed upon one branch circuit of the discharging circuit K2 equals zero. The maximum time constant $\tau$ is accordingly determined by the sum of the resistances $R_{BP2}$ and $R_G$ and the input capacitance. The resistance $R_{BP2}$ should preferably be distinctly greater than the gate resistance $R_G$.

By virtue of the current mirror SP, we obtain a controllable current sink with the positive feed-back loop containing the MOS field-effect transistor Q3 of the sensing circuit K3 and the MOS field-effect transistor Q4. Generally, positive feed-back occurs according to the same principle as when turning on via the charging circuit K1.

As can be seen from the diagram in FIG. 2, the slew rate of the drain-source voltage $U_{DS}$ of the MOS field-effect transistor QO during the turn-off process or during the transition of the MOS field-effect transistor QO from the conducting to the off state is so reduced, that in the critical area at the end of the turn-off process, we again have a sinusoidally rounded transition instead of the usual angular transition hitherto. At the beginning of turn-off process, we obtain a rounded transition despite the switched MOS field-effect transistor Q2A, because of the typical shape of the drain-source resistance in relation to the gate-source voltage. The slew rate of the drain-source voltage $U_{DS}$ which becomes increasingly slower towards the end of the turn-off process, is again caused by a time constant $\tau$ which is becoming larger, according to which the input capacitance of the MOS field-effect transistors QO and Q3 is charged. The maximum time constant $\tau$ at the end of the turn-off process is determined by the sum of the two resistances $R_{BP2}$ and $R_G$ and the input capacitance, whilst the minimum time constant at the beginning of the turn-off process is determined by the sum of the resistances R2 and $R_G$ and the input capacitance. The current-limiting resistance R2 in the branch current of the discharging circuit K2 containing the MOS field-effect transistor Q2A is, in turn, significantly smaller than the resistance $R_{BP2}$, which in turn is distinctly larger than the gate resistance $R_G$.

The current-limiting resistances R1, R2 and R5 of the charging circuit K1, the discharging circuit K2 or the current mirror SP may be of the same magnitude. The current-limiting resistance R4 of the current mirror SP will preferably also have the same value as the resistances named above.

At the output of the MOS field-effect transistor QO allocated to the supply circuit KO, a square wave signal with rounded edges and preferably of sinusoidal shape, is therefore generated, whose proportion of higher harmonics is distinctly reduced.

In particular this is the result of a comparison undertaken in FIG. 3 with a pure, sharp-edged square-wave signal.

The top part of FIG. 3a shows the frequency spectrum of a pure, sharp-edged square wave signal. In the corresponding diagram, the amplitude is plotted against the ordinal of the harmonics. In contrast, the top part of FIG. 3b shows the frequency spectrum of a square-wave signal with rounded edges, as generated at the output of the MOS field-effect transistor QO driven by the circuit arrangement 10 of FIG. 1.

The measurement results shown were obtained for the following parameters for the pure square-wave signal and the square-wave signal with rounded edges and the appropriate energization:
Fundamental frequency $f_1$=20 kHz
Duty cycle=50%
Amplitude A=5 V For the pure, i.e. sharp-edged square-wave signal shown in FIG. 3a, the maximum slew rate around a given edge can be assumed to be infinite. In the case of a square-wave signal with sinusoidally rounded edges, the maximum slew rate=2 V/$\mu$s.

As can be seen when comparing FIGS. 3b and 3a, the proportion of higher harmonics in the case of a square-wave signal with rounded edges shown in FIG. 3b is distinctly smaller than in the case of a pure, sharp-edged square-wave signal, shown in FIG. 3a.

As can be seen from FIG. 4, the proportion of higher harmonics of a square-wave signal with sinusoidally rounded edges, is distinctly reduced even compared with a trapezoidal signal.

This FIG. 4 shows a logarithmic representation of the amplitude of the higher harmonics compared to the frequency, where the appropriate amplitude gradient for a pure, sharp-edged square-wave signal (1), a trapezoidal signal (2) and a square-wave signal (3) with sinusoidally rounded edges is depicted by the three curves (1), (2) and (3), as obtained from the circuit arrangement 10 in FIG. 1. The measured values shown were obtained with the following parameters for the relevant output signal or corresponding energization:

| | |
|---|---|
| basic frequency $f_1$ | = 20 kHz |
| amplitude A | = 5V |
| duty cycle | = 50% |
| max. slew rate for the trapezoidal signal and for the square-wave signal with sinusoidally rounded edges, in each case | = 2V $\mu$s |

As can be seen from the diagram shown in FIG. 4, in the case of a square-wave signal with sinusoidally rounded edges, as obtained at the output of the MOS field-effect transistor QO driven by the circuit arrangement 10 in FIG. 1, a reduction in the proportion of higher harmonics corresponding to 60 dB/decade is achieved. Therefore, the proportion of higher harmonics is also distinctly smaller than in the case of a trapezoidal output signal, for which a value of 40 dB/decade was determined. For a pure, sharp-edged square-wave signal, the amplitudes of the higher harmonics on the other hand, work out at 20 dB/decade.

In this way, as a result of the circuit arrangement according to the invention and the square-wave signal with rounded edges, preferably of sinusoidal shape thus generated, the proportion of higher harmonics in the output signal is considerably reduced thereby distinctly reducing in particular, the risk of electromagnetic hum. Although the slew rate of the output signal is kept relatively high in the uncritical areas, there is nonetheless a good response characteristic.

We claim:

1. Circuit arrangement (10) for driving an MOS field-effect transistor (QO) allocated to the supply circuit (KO) of an electrical load ($R_L$), having a charging circuit (K1) that can be connected to the MOS field-effect transistor (QO) and a discharging circuit (K2), which can be connected to the MOS field-effect transistor (QO), via which the input capacitance of the MOS field-effect transistor (QO) can be charged or discharged according to a time constant ($\tau$) that is dependent upon the magnitude of the input capacitance and the dimensional design of the charging or discharging circuit (K1, K2), characterised in that a sensing circuit (K3) is provided which delivers a measuring signal ($S_M$) that is representative of the gate-source voltage ($U_{GS}$) of the MOS field-effect transistor (QO) of the supply circuit (KO), and that, depending on this measuring signal ($S_M$), the internal resistance of the charging or discharging circuit (K1, K2) and/or a current ($I_a$) impressed upon these circuits (K1, K2) in the sense of a positive feedback is controlled in such a way, that the resulting time constant ($\tau$), according to which the input capacitance of the MOS field-effect transistor (QO) of the supply circuit (KO) is charged or discharged, becomes continuously smaller during the transition of the MOS field-effect transistor (QO) from the off-state to the conducting state and continuously larger during the transition from the conducting to the off-state.

2. Circuit arrangement according to claim 1, characterised in that, the sensing circuit (K3) contains an MOS field-effect transistor (Q3), the gate electrode of which is connected to the gate electrode the MOS field-effect transistor (QO) of the supply circuit (KO) and the source electrode of which is connected to the source electrode of the MOS field-effect transistor (QO) of the supply circuit (KO).

3. Circuit arrangement according to claim 1, characterised in that, the MOS field-effect transistor (QO) of the supply circuit (KO) in a source circuit is connected to the electrical load ($R_L$).

4. Circuit arrangement according to claim 2, characterised in that, the MOS field-effect transistor (Q3) of the sensing circuit (K3) in a source circuit is connected to a resistor (R3), where the measuring signal ($S_M$) is generated.

5. Circuit arrangement according to claim 1, characterised in that, the charging and/or discharging circuit (K1, K2) each contains a parallel connection consisting of a first branch circuit with at least a first ohmic resistance ($R_{BP1}$; $R_{BP2}$) and a second branch circuit with a second, controllable resistance (Q1, Q2A), which is driven according to the measuring signal ($S_M$).

6. Circuit arrangement according to claim 5, characterised in that, the controllable resistance is a MOS field-effect transistor (Q1, Q2A).

7. Circuit arrangement according to claim 5, characterised in that, the MOS field-effect transistor (Q1, Q2A) in the second branch circuit of the parallel connection is connected in series to a current-limiting resistance (R1, R2).

8. Circuit arrangement according to claim 5, characterised in that, the MOS field-effect transistor (Q1) of the parallel connection contained in the charging circuit (K1) is driven directly by the measuring signal ($S_M$).

9. Circuit arrangement according to claim 5, characterised in that, the first branch circuit of the parallel connection contained in the discharging circuit (K2) and having the MOS field-effect transistor (Q2A), is formed by the output-side branch circuit of a current mirror (SP) in the input side branch circuit of which a controllable resistance (Q4) is provided, which is driven according to the measuring signal ($S_M$).

10. Circuit arrangement according to claim 9, characterised in that, the controllable resistance in the input side branch circuit of the current mirror (SP) is an MOS field-effect transistor (Q4).

11. Circuit arrangement according to claim 10, characterised in that, the MOS field-effect transistor (Q4) provided in the input-side branch circuit of the current mirror (SP) forming the controllable resistance, is directly driven by the measuring signal ($S_M$).

12. Circuit arrangement according to claim 1, characterised in that a gate resistance ($R_G$) is connected between the gate electrode of the MOS field-effect transistor (QO), of the supply circuit (KO) and the connectable charging or discharging circuit (K1, K2).

13. Circuit arrangement according to claim 1, characterised in that the charging or discharging circuit (K1, K2) can be connected by an electronic switch (S).

14. Circuit arrangement according to claim 13, characterised in that the electronic switch (S) can be reversed between connecting the charging circuit (K1) and connecting the discharging circuit (K2).

* * * * *